(12) United States Patent
Quitoriano et al.

(10) Patent No.: US 7,964,927 B2
(45) Date of Patent: Jun. 21, 2011

(54) SEMICONDUCTOR DEVICE AND METHOD FOR STRAIN CONTROLLED OPTICAL ABSORPTION

(75) Inventors: Nathaniel Quitoriano, Pacifica, CA (US); Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 218 days.

(21) Appl. No.: 12/243,155

(22) Filed: Oct. 1, 2008

(65) Prior Publication Data

US 2009/0108387 A1    Apr. 30, 2009

Related U.S. Application Data

(60) Provisional application No. 61/001,222, filed on Oct. 30, 2007.

(51) Int. Cl.
*H01L 31/0232* (2006.01)

(52) U.S. Cl. ................... 257/432; 257/E31.127; 438/65

(58) Field of Classification Search .................. 257/415, 257/432, E31.127; 438/50, 65
See application file for complete search history.

(56) References Cited

U.S. PATENT DOCUMENTS

| 5,387,803 | A  | * | 2/1995  | Kurtz et al. ..................... 257/3 |
| 6,927,387 | B2 | * | 8/2005  | Viktorovitch et al. ........ 250/226 |
| 6,946,318 | B2 | * | 9/2005  | Wada et al. ..................... 438/94 |
| 7,291,904 | B2 | * | 11/2007 | Matsuda et al. ............... 257/684 |
| 7,485,799 | B2 | * | 2/2009  | Guerra .......................... 136/245 |
| 7,605,391 | B2 | * | 10/2009 | Burns ............................ 257/21 |
| 2008/0061222 | A1 | * | 3/2008 | Powers et al. ................ 250/226 |
| 2009/0116095 | A1 | * | 5/2009 | Guerra .......................... 359/245 |

* cited by examiner

*Primary Examiner* — Allan R Wilson

(57) ABSTRACT

A semiconductor device which has controlled optical absorption includes a substrate, and a semiconductor layer supported by the substrate. The semiconductor has variable optical absorption at a predetermined optical frequency in relationship to a bandgap of the semiconductor layer. Also included is a strain application structure coupled to the semiconductor layer to create a strain in the semiconductor layer to change the semiconductor bandgap.

20 Claims, 7 Drawing Sheets

SEMICONDUCTOR DEVICE AND METHOD FOR STRAIN CONTROLLED OPTICAL ABSORPTION

CROSS-REFERENCE TO RELATED APPLICATION

The present application claims priority from provisional application Ser. No. 61/001,222, filed Oct. 30, 2007, the contents of which are incorporated herein by reference in their entirety.

BACKGROUND

Silicon is the dominant semiconductor for photolithographically fabricated electronics. Modern computing and telecommunications devices comprise large blocks of integrated circuits including large cache memories, large register files, and large instruction decoding units. Clock signals and data drivers often talk to a large number of on-chip circuits as well as chip-to-chip circuits. Also, propagation delay for on-chip and chip-to-chip components is increasing with higher densities and smaller feature dimensions. Since the speed of light is faster than the flow of electrons in conductive interconnects, there is a growing desire to integrate optoelectronics into systems for telecommunications and computer interconnections.

Increasing use is being made of integrated optoelectronics to convert electrical signals from integrated circuits into optical signals for transmission. An optical signal may travel over a waveguide or in free space to a detector which converts it back into an electrical signal. Information may be encoded into these optical signals through modulators which may modulate the amplitude or the frequency of the optical signal. However, the total propagation delay from an integrated circuit across the optoelectronics includes the delay through a detector and a modulator. Therefore, efficient detectors and modulators with low propagation delay are desirable for the continued success of very large scale integrated circuits, chip-to-chip and board-to-board interconnections.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

DETAILED DESCRIPTION OF EXAMPLE EMBODIMENTS

Figure 1:
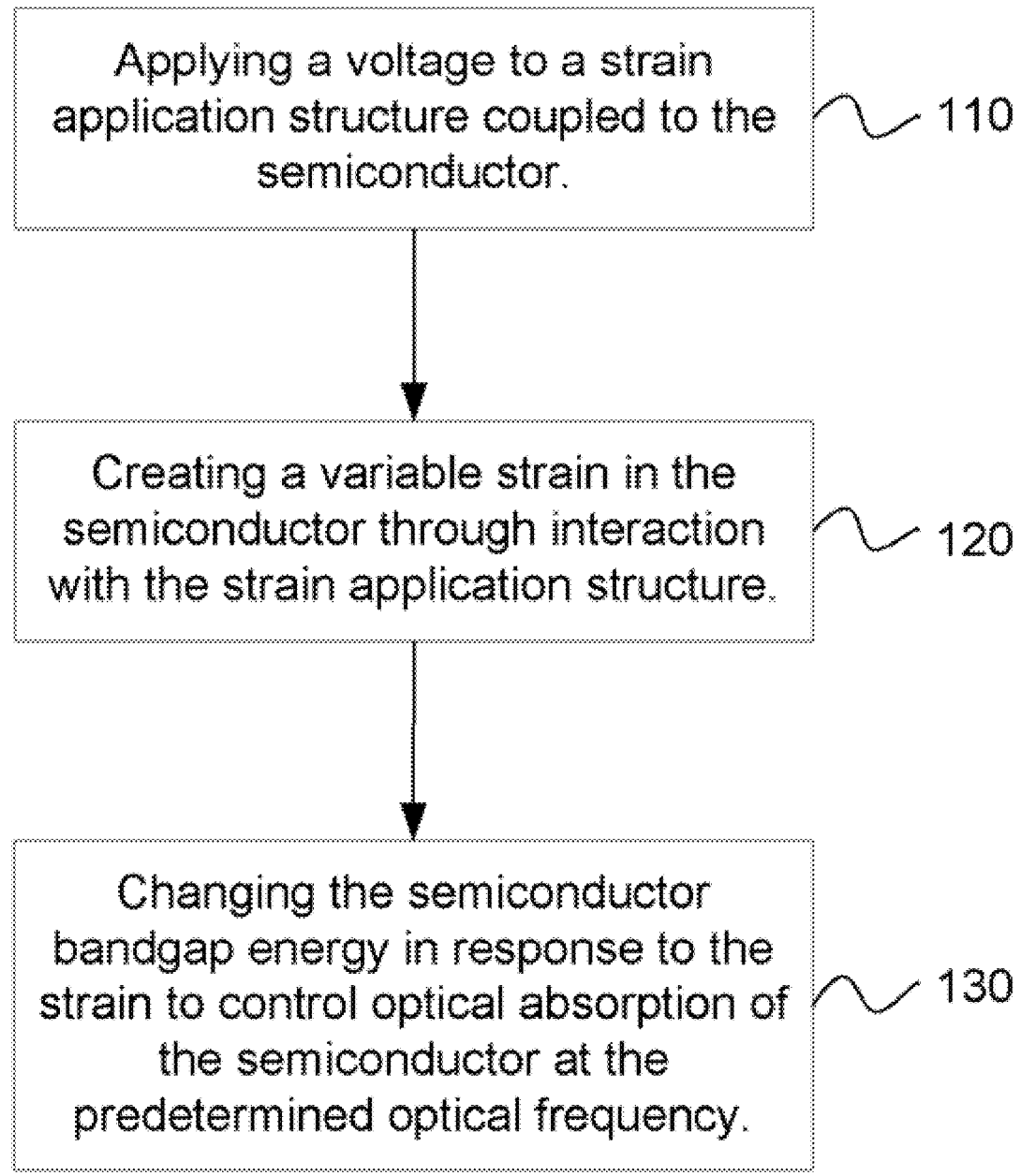
FIG. 1 is a flow chart depicting a method for changing the optical absorption at a predetermined optical frequency of a semiconductor in accordance with an embodiment of the present invention.

In describing embodiments of the present invention, the following terminology will be used.

The singular forms "a," "an," and "the" include plural referents unless the context clearly dictates otherwise. Thus, for example, reference to "a device" includes reference to one or more of such devices.

As used herein, dimensions, sizes, formulations, parameters, shapes and other quantities and characteristics are not and need not be exact, but may be approximated and/or larger or smaller, as desired, reflecting tolerances, conversion factors, rounding off, measurement error and the like and other factors known to those of skill in the art.

Reference will now be made to the exemplary embodiments illustrated, and specific language will be used herein to describe the same. It will nevertheless be understood that no limitation of the scope of the invention is thereby intended.

When discussing optoelectronic components, optical properties of the component are closely related to the bandgap of semiconductor materials used within the optically-active portions of the device. Bandgap is the energy difference between the valence band and the conduction band in a semiconductor. Bandgap affects the optical properties of a semiconductor such as optical absorption. Optical absorption occurs most efficiently when a photon's energy is equal to the energy difference between the valence and conduction bands in the semiconductor at the same crystal momentum. Photons having less energy tend to pass through the semiconductor unaffected. Photons having greater energy tend to be absorbed, although this energy absorption can have decreasing efficiency for photons with energy significantly higher than the bandgap.

The energy of a photon of light is directly related to its frequency by the equation $E=hf$ where h is Planck's constant and f is the frequency of the photon. Therefore transition from the valence band edge to the conduction band edge may be caused by a specific frequency of light. That is, an absorbed photon with the energy and frequency exactly the same as the energy difference between band edges corresponds to the most efficient energy absorption.

It has been found that strain introduced into a semiconductor's crystal (or polycrystal) lattice can affect the bandgap. For example, tensile or compressive strain may be created by the fabrication process, but the resulting strain is of course dependent on the details of the fabrication process. Strain introduced in such a manner is fixed, and varies little during operation (except, perhaps affected by temperature). Alternative means to engineer and control bandgap, such as quantum wells, can be difficult to build and control, and provide limited ability to vary the bandgap.

Accordingly, techniques for applying and varying strain to a semiconductor have been developed that can be used to electronically vary the bandgap of a semiconductor. When the semiconductor is used as the optically active portion of an optoelectronic device, the electronic control of bandgap can be used to affect optical properties. Accordingly, useful devices such as for example, modulators and detectors can be made.

FIG. 1 is a flow chart depicting a method for changing the optical absorption at a predetermined optical frequency of a semiconductor. The degree to which most materials absorb light is a function of the optical frequency of the light and therefore the device characteristics may be designed for a predetermined optical frequency. For example, 1550 nm is the wavelength of infrared light used in many communications applications. Step 110 applies a voltage to a strain application structure coupled to the semiconductor. Alternatively, a variable mechanical strain may be applied to the strain application structure which in turn may produce a mechanical strain in the semiconductor. Step 120 creates a variable strain in the semiconductor through interaction with the strain application structure. For example, this may include applying a variable voltage through the strain application structure so that the semiconductor develops strain in response to the voltage. The strain application structure may also apply mechanical strain to the semiconductor. For example, a piezoelectric element may be included in the strain application structure to interact mechanically with the semiconductor. Step 130 changes the semiconductor bandgap energy in response to the strain to control optical absorption of the semiconductor at the predetermined optical frequency.

Cutoff wavelength refers to the maximum wavelength at which light is absorbed by the semiconductor. Wavelengths of light shorter than the cutoff wavelength are absorbed in the semiconductor. Creating a tensile or compressive strain in the semiconductor varies the semiconductor energy bandgap and thereby varies the optical cutoff wavelength. For example, for suitable application of mechanical strain to germanium, the cutoff wavelength can be increased to about 1550 nanometers by tensile strain. Other materials may also be suitable in addition to germanium, such as GaSb or ternary and quaternary compound semiconductors, to modulate this wavelength.

Figure 2A:
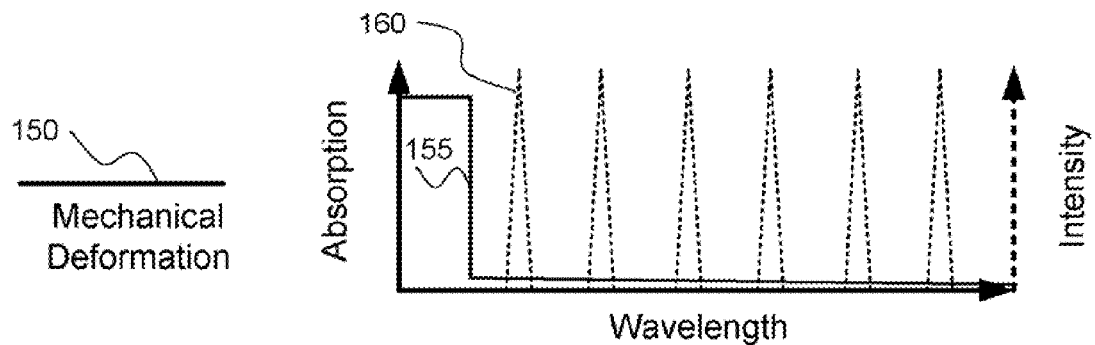
FIG. 2a depicts the relationship between optical absorption and zero mechanical deformation at various wavelengths in accordance with an embodiment.

Through the piezoelectric effect, the electric field may change the strain, and therefore the bandgap and in turn the cutoff wavelength of a material. However, other methods embodied may also change the strain and therefore the bandgap of a material and thereby move the cutoff wavelength of the material. An example of using the piezoelectric effect is applying a voltage to a layer adjacent to the semiconductor layer to cause mechanical changes in the dimensions of the layer. For example, the material forming the adjacent layer can be selected to be one with high piezoelectric coefficient. FIG. 2 depicts the operation of tuning the semiconductor device to absorb certain wavelengths while transmitting other wavelengths. For example, FIG. 2a shows the wavelength absorption for a semiconductor with no mechanical deformation represented by 150. Light absorption is plotted on the left ordinate axis, optical intensity is plotted on the right ordinate axis and wavelength is plotted on the abscissa. Wavelengths to the left of the square wave or cutoff 155 are almost completely absorbed in the semiconductor while wavelengths to the right are not absorbed. The dashed-line spikes 160 and spikes to the right represent light intensity at various wavelengths, as in an optical communication signal with different signals at different narrowly spaced frequencies. The wavelengths 160 and wavelengths to the right are not absorbed but rather pass through the semiconductor structure.

Figure 2B:
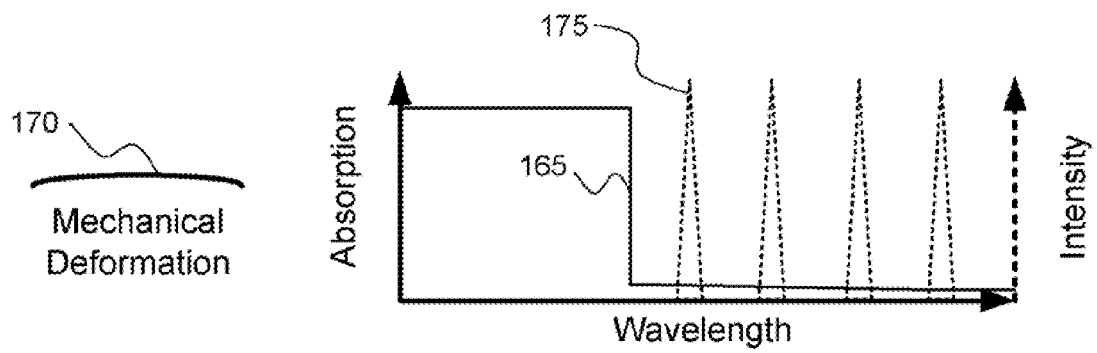
FIG. 2b depicts the relationship between optical absorption and some mechanical deformation at various wavelengths in accordance with an embodiment.
Figure 2C:
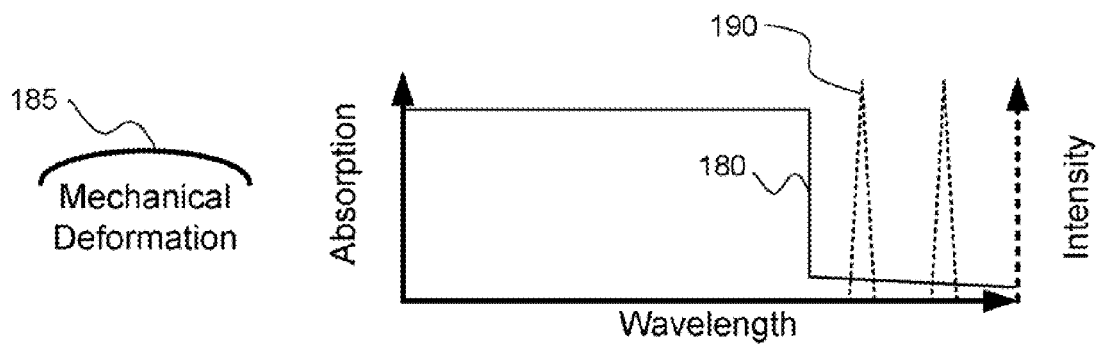
FIG. 2c depicts the relationship between optical absorption and increased mechanical deformation at various wavelengths in accordance with an embodiment.

FIG. 2b shows an increase in the cutoff depicted by 165 due to a mechanical deformation 170 in the semiconductor from a tensile strain. Wavelengths shorter than the cutoff wavelength 165 are absorbed in the semiconductor and those including 175 and higher are not absorbed. FIG. 2c shows a further increase in the cutoff depicted by 180 due to an increase in the mechanical deformation 185 in the semiconductor from an increased tensile strain. Wavelengths which are not absorbed are those wavelengths longer than 180. Thus selected wavelengths can be absorbed by changing the bias voltage which in turn changes the mechanical deformation.

As another example, inducing strain in a semiconductor layer may include using a longitudinal electric field parallel a largest surface of a semiconductor layer or applying an electric field perpendicular to a largest surface of a semiconductor layer to directly introduce strain into the semiconductor layer.

Figure 3:
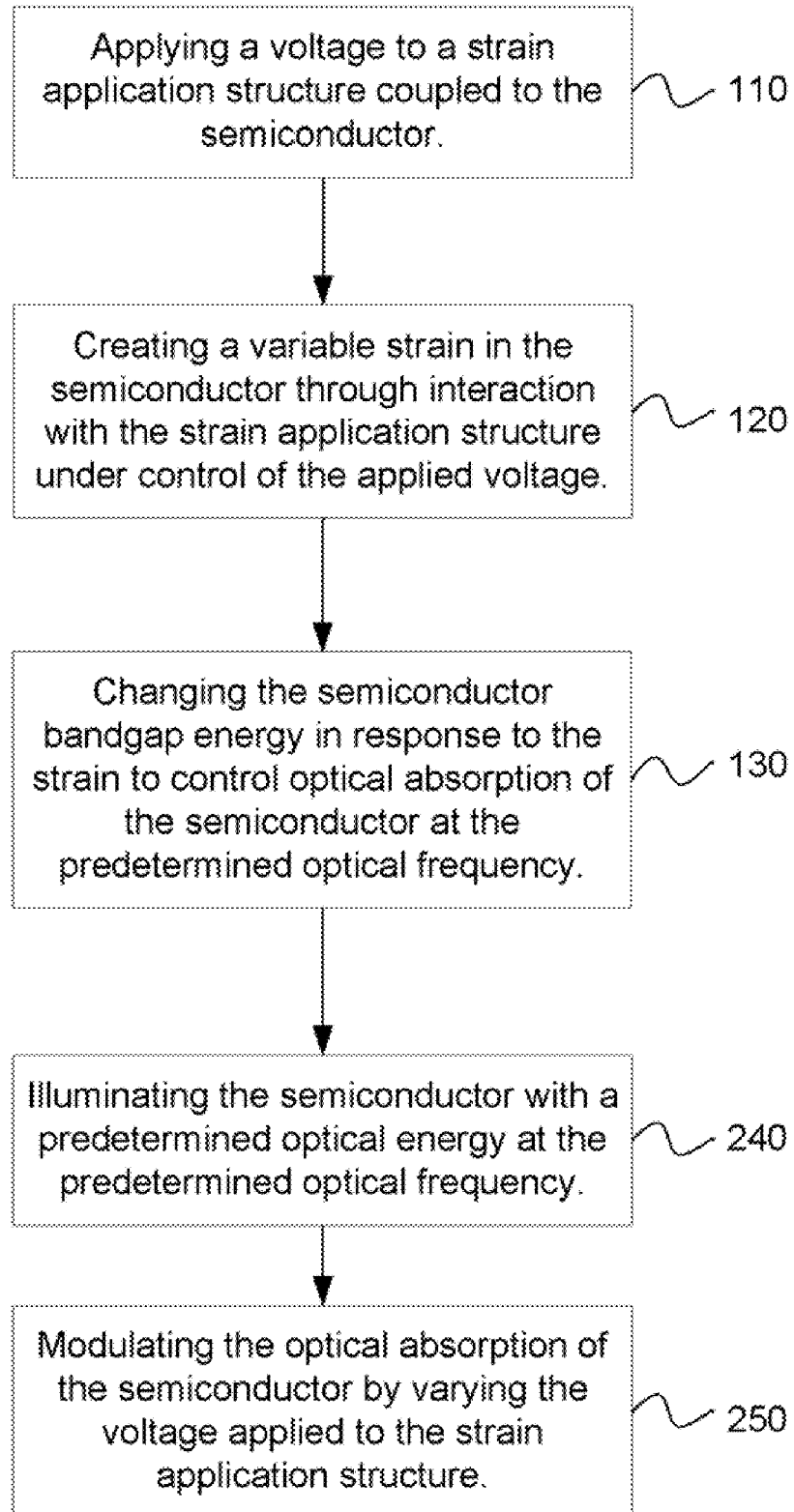
FIG. 3 is a flow chart depicting a method for modulating optical energy in accordance with an embodiment of the present invention.

FIG. 3 is a flow chart depicting a method for modulating optical energy. A small change in the bandgap greatly changes the absorption coefficient by virtue of moving the cutoff wavelength. The method may include Steps 110, 120, and 130 as described above. Step 240 may include illuminating the semiconductor with a predetermined optical energy at the predetermined optical frequency. Step 250 modulates the optical absorption of the semiconductor by varying the voltage applied to the strain application structure. The applied voltage can be changed with time so that the absorption coefficient changes with time. When the absorption coefficient decreases, more light penetrates through the semiconductor layer (and the underlying substrate, if it is transparent to light). When the absorption coefficient increases, less light penetrates through the semiconductor. Thus, information from the electrical signal can modulate light passing through the semiconductor layer and the substrate. Alternatively, variations in the light reflected from the surface can be used to modulate an optical signal. The semiconductor may be germanium.

The cutoff wavelength of germanium, beyond which optical absorption decreases markedly and the corresponding absorption wave length increases greatly, is near 1550 nm. Photo detectors and modulators of interest for optical interconnections and modulators at 1550 nm wavelength can be fabricated in a germanium layer integrated onto a silicon substrate, which may contain processing or other electrical components of an integrated circuit.

Figure 4:
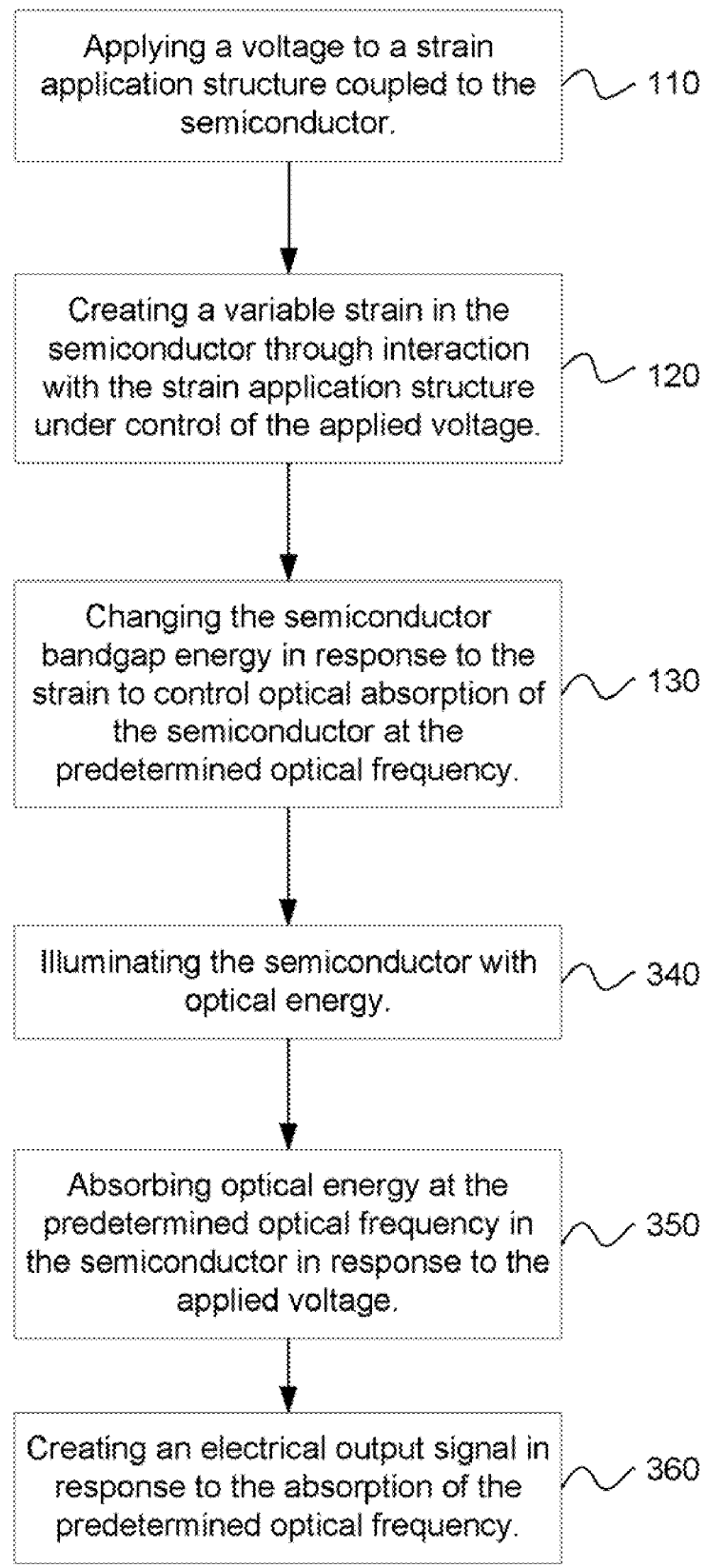
FIG. 4 is a flow chart depicting a method for detecting optical energy in accordance with an embodiment of the present invention.

FIG. 4 is a flow chart depicting a method for detecting optical energy. The voltage can be applied continuously to shift the cutoff wavelength and provide adequate absorption for the germanium layer to act as a photo detector. The method can include Steps 110, 120, and 130 as described above. Step 340 illuminates the semiconductor with optical energy. Step 350 absorbs the optical energy at the predetermined optical frequency in the semiconductor in response to the applied voltage, and step 360 creates an electrical output signal in response to the absorption of optical energy at the predetermined optical frequency. In an alternative embodiment, absorbing optical energy at the predetermined optical frequency in the semiconductor may further comprise absorbing optical energy in relation to the intensity of the optical energy.

Figure 5:
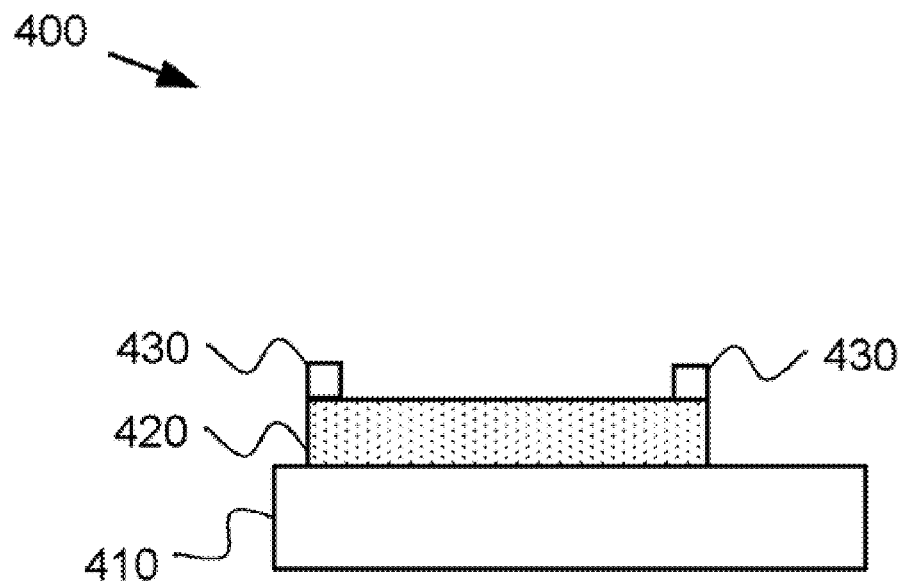
FIG. 5 is a semiconductor device having controlled optical absorption in accordance with an embodiment of the present invention.

FIG. 5 is a semiconductor device 400 having controlled optical absorption in accordance with an embodiment. Element 410 is a substrate. The substrate may comprise silicon. Element 420 is a semiconductor layer supported by the substrate. The semiconductor layer has variable optical absorption at a predetermined optical frequency in relationship to a bandgap of the semiconductor layer. In accordance with an embodiment, the semiconductor layer may comprise germanium. The semiconductor layer may also have intrinsic strain resulting from a difference in lattice constants between the semiconductor layer and the substrate as fabricated and differences in the thermal coefficients of expansion of the layer material and the substrate material or as the result of other processing conditions. The semiconductor layer 'supported by' the substrate is inclusive of the semiconductor layer disposed immediately adjacent the substrate or the strain application structure disposed between the substrate and the semiconductor layer. Multiple semiconductor layers may also be supported by multiple sides of a substrate and be interposed between multiple layers of strain application structures in alternate embodiments.

Element 430 of FIG. 5 is a strain application structure coupled to the semiconductor layer to create a strain in the semiconductor layer to change the semiconductor bandgap under control of an applied voltage. The strain application structure may be at least two contacts coupled to the semiconductor layer. A voltage is applied to the strain application structure. The strain in the semiconductor includes both the intrinsic strain created by the materials and the fabrication process and also the extrinsic strain induced by the applied voltage. For example, the semiconductor may comprise a piezoelectric material. Therefore the voltage varies the total strain in the semiconductor from the intrinsic strain. A variable voltage may further vary the total strain by changing the amount of extrinsic strain induced in the semiconductor.

Figure 6:
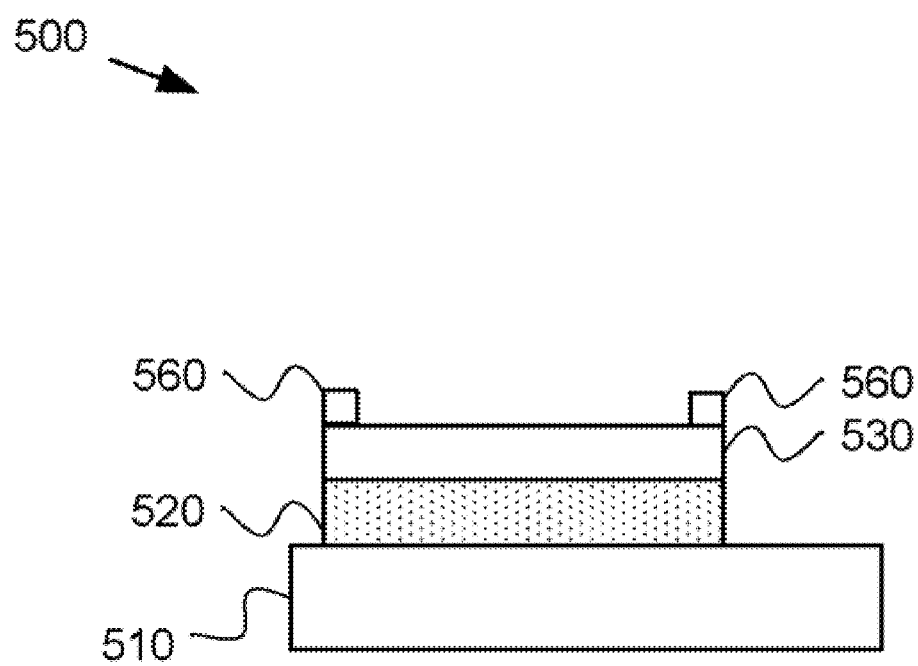
FIG. 6 is a semiconductor device having a strain application structure and controlled optical absorption in accordance with an embodiment of the present invention.

FIG. 6 is a semiconductor device 500 having controlled optical absorption in accordance with an embodiment. Element 510 is a substrate. Element 520 is a semiconductor layer supported by the substrate. The semiconductor has variable optical absorption at a predetermined optical frequency in relationship to a bandgap of the semiconductor layer. Element 530 is a strain application structure coupled to the semiconductor layer to create a strain in the semiconductor layer to change the semiconductor bandgap under control of an applied voltage. The strain application structure or strain application layer may be interposed between the semiconductor layer and the substrate and is therefore supported by the substrate. The strain application structure may comprise an electrically active mechanically responsive material. The strain application structure may also comprise a piezoelectric material. The voltage is applied to the strain application structures through contacts 560 which form a part of the strain application structure.

As may be appreciated by those skilled in the art, an embodiment of the device as claimed herein may further comprise an optical waveguide adjacent the semiconductor for guiding optical energy to or away from the semiconductor.

The FIG. 5 and FIG. 6 devices may function as optical modulators when the applied voltages are variable with time. The FIG. 5 and FIG. 6 devices may also function as optical detectors in accordance with an embodiment. When configured as optical detectors, the semiconductor absorbs a fraction of optical energy incident at a predetermined optical frequency as controlled by the applied voltage or the applied mechanical strain. An electrical signal is created in response to the absorption of the predetermined optical frequency and intensity. Thus an electrically or mechanically tunable cutoff wavelength and the corresponding optical absorption for photo detectors and optical modulators results when a variable voltage generates a variable electric field or mechanical strain is applied. The modulation can be rapid to encode data on the optical signal traversing the semiconductor. Alternatively, the electrical or mechanical change can be kept constant for a period of time during operation of the device to "bias" or adjust the cutoff wavelength for a specific application.

Figure 7A:
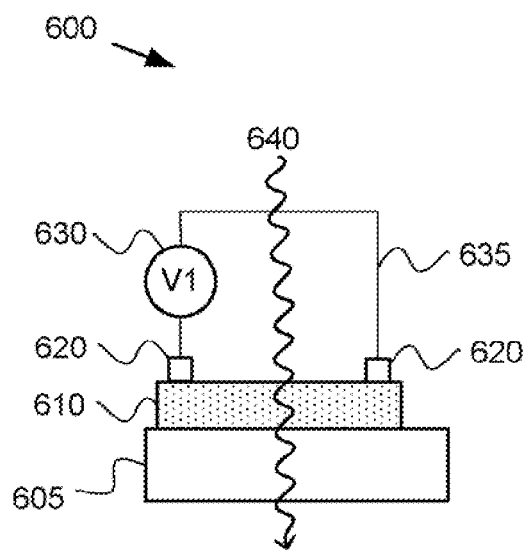
FIG. 7a is a semiconductor device under control of a time variable voltage source of value V1 in accordance with an embodiment of the present invention at time t1.
Figure 7B:
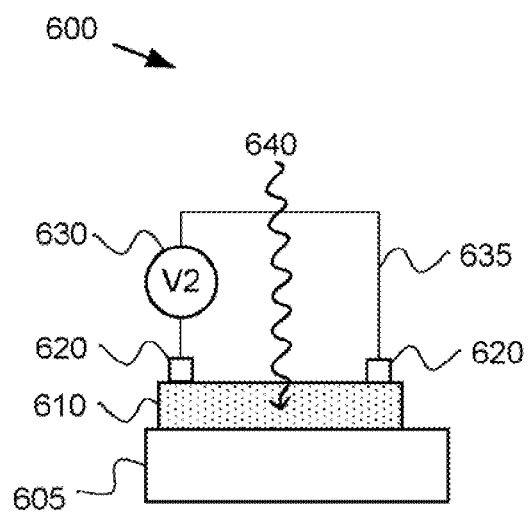
FIG. 7b is the semiconductor device of FIG. 7a under control of the time variable voltage source of value V2 in accordance with an embodiment at time t2.

FIG. 7a is a semiconductor device 600 under control of a time variable voltage source of value V1 in accordance with an embodiment at time t1. Element 610 is a semiconductor layer supported by the substrate. Element 620 is a strain application structure coupled to the semiconductor layer to create a strain in the semiconductor layer to change the semiconductor bandgap under control of an applied voltage 630 labeled V1. In an alternate embodiment, the strain application structure may also be interposed between the substrate and the semiconductor layer. The voltage V1 is applied to the strain application structures across a conducting medium 635. Illuminating optical energy 640 is depicted passing through the semiconductor under control of voltage V1. In contrast, FIG. 7b is the same semiconductor device 600 under control of a time variable voltage source of value V2 in accordance with an embodiment at time t2. However, the illuminating optical energy 640 is absorbed in the semiconductor due to the influence of V2 on the semiconductor bandgap. Therefore a modulator is created by the ability to both pass optical energy and absorb it through varying applied voltages on the semiconductor.

In an alternate embodiment, multiple and independent voltage sources may be applied to multiple modulators on a common substrate. As independent modulators, each may be illuminated with a predetermined optical energy at a predetermined optical frequency. Where a common optical energy and frequency are applied, an array of modulators may result which select different wavelengths depending on respective values of voltages applied to each strain application structure.

Figure 8A:
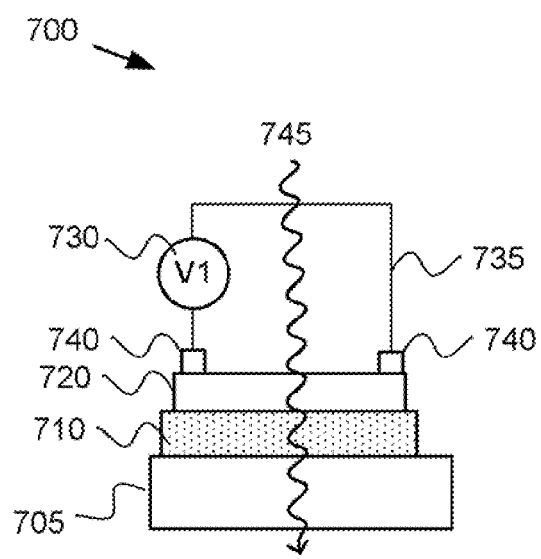
FIG. 8a is a semiconductor device having multiple strain application structures, and multiple applied voltages in accordance with an embodiment of the present invention.
Figure 8B:
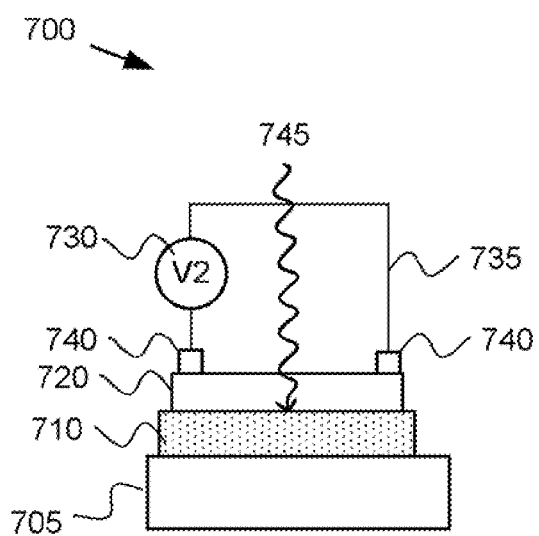
FIG. 8b is the semiconductor device of FIG. 8a under control of a time variable source of value V2 in accordance with an embodiment at time t2.

FIG. 8a is a semiconductor device 700 having multiple strain application structures, and multiple applied voltages as depicted in singular in FIG. 6 in accordance with an embodiment. Element 705 is a substrate. Element 710 is a semiconductor layer supported by the substrate. Element 720 is a strain application structure coupled to the semiconductor layer to create a strain in the semiconductor layer to change the semiconductor bandgap under control of an applied voltage 730 labeled V1. The voltage V1 is applied to the strain application structure across a conducting medium 735 through a pair of contacts 740. Illuminating optical energy 745 passes through the semiconductor at the voltage V1 and the frequency equal to E/h of the optical energy 745. In contrast, FIG. 8b is the same semiconductor device 700 under control of a time variable voltage source of value V2 in accordance with an embodiment at time t2. However, the illuminating optical energy 745 is absorbed in the semiconductor due to the influence of V2 on the semiconductor bandgap. In an embodiment, a voltage may be applied to the strain application structure to transmit light instead of absorb light in the semiconductor.

Figure 9:
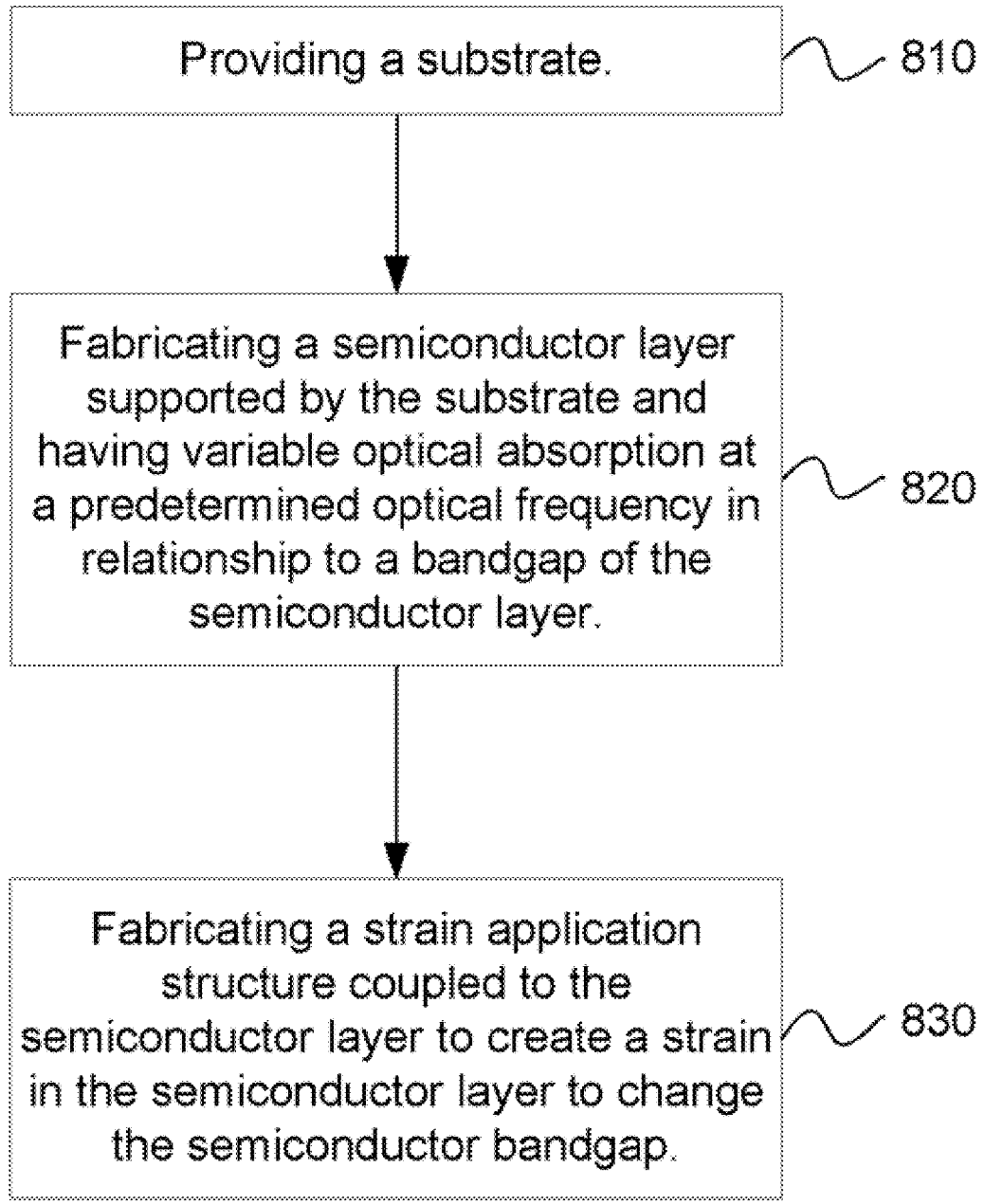
FIG. 9 is a flow chart depicting a method of making a semiconductor device having controlled optical absorption in accordance with an embodiment of the present invention.

FIG. 9 is a flow chart depicting a method of making a semiconductor device having controlled optical absorption. Step 810 provides a substrate. A substrate may be cut from a silicon ingot, a glassy material or formed from a plastic, or a fabric material. Substrates provide a substantially flat surface on which to grow or form active semiconductor devices. Substrates often provide mechanical strength but can also be flexible. Substrates are usually electrically non-conductive or may include an electrically non-conductive layer and may vary in thickness depending on the mechanical strength needed and the cost targeted in manufacturing. The flexible substrate may be a thicker layer of a material that is inherently mechanically flexible. Alternatively, it can be thinner layer of a material that is generally not considered flexible (e.g., silicon), but can be deformed readily if made thin enough.

A flexible substrate may be mechanically deformed to change the stress in the semiconductor layer and alter its bandgap. This deformation may be used to bias the stress to a value different from that built in by the intrinsic stress from the materials, the difference in thermal coefficients of expansion of the semiconductor layer and the substrate, and the fabrication process. The mechanical actuation may vary slowly with time and may be used separately or in combination with rapid electrical modulation and, therefore, may serve a different function than high-speed modulation. For example, the mechanical deformation may tune the semiconductor device to pass longer wavelength channels of a wavelength multiplexed optical signal while blocking channels corresponding to shorter wavelengths. This application does not require very high-speed modulation of the optical characteristics of the semiconductor layer by the mechanical stress. The mechanical modulation can be applied physically or, as discussed above, electrically.

Step 820 of FIG. 9 fabricates a semiconductor layer supported by the substrate. The semiconductor has variable optical absorption at a predetermined optical frequency in relationship to a bandgap of the semiconductor layer. The semiconductor layer may be fabricated to comprise germanium and the substrate may be fabricated to comprise silicon. Furthermore, the semiconductor layer may be fabricated by depositing semiconductor material onto the substrate under conditions suitable to produce intrinsic strain within the semiconductor layer.

Step 830 of FIG. 9 fabricates a strain application structure coupled to the semiconductor layer to create a strain in the semiconductor layer to change the semiconductor bandgap. Strain in the semiconductor may be created under control of a voltage applied to the strain application structure or alternatively may be created mechanically by the application of a mechanical force to the strain application structure. In accordance with an embodiment, a method of making a device may further include fabricating the strain application structure to be an electrically active, mechanically responsive layer on the substrate. In accordance with another embodiment, the strain application structure may be fabricated to include at least two contacts coupled to the semiconductor.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein.

What is claimed is:

1. A semiconductor device for modulating light transmissions through the device comprising:
  a substrate;
  a semiconductor layer supported by the substrate and having variable optical absorption at a predetermined optical frequency in relationship to a bandgap of the semiconductor layer; and
  a strain application structure coupled to the semiconductor layer to create a strain in the semiconductor layer to change the semiconductor bandgap,
  wherein the strain application structure is capable of creating a mechanical deformation of the semiconductor layer,
  wherein selected optical frequencies pass through the substrate, the semiconductor layer, and the strain application structure, and
  a variable voltage or a variable mechanical strain applied to the strain application structure to create a strain in the semiconductor layer to change the semiconductor bandgap.

2. A device as in claim 1, wherein the semiconductor layer comprises germanium.

3. A device as in claim 1, wherein the semiconductor layer has intrinsic strain resulting from a difference in lattice constants between the semiconductor layer and the substrate.

4. A device as in claim 1, wherein the semiconductor layer has intrinsic strain resulting from a difference in thermal coefficients of expansion or different lattice constants between the semiconductor layer and the substrate.

5. A device as in claim 1, wherein the substrate comprises silicon.

6. A device as in claim 1, wherein the strain application structure comprises an electrically active mechanically responsive material.

7. A device as in claim 1, wherein the strain application structure comprises piezoelectric material.

8. A device as in claim 1, wherein the strain application structure comprises at least two electrical contacts coupled to the semiconductor layer.

9. A device as in claim 1, further comprising an optical waveguide adjacent the semiconductor.

10. A device as in claim 1, wherein the semiconductor device modulates optical infrared frequencies.

11. A method of making a semiconductor device for modulating light transmissions through the device comprising:
  providing a substrate;
  fabricating a semiconductor layer supported by the substrate and having variable optical absorption at a predetermined optical frequency in relationship to a bandgap of the semiconductor layer; and
  fabricating a strain application structure coupled to the semiconductor layer comprises forming an electrically active, mechanically responsive layer on the substrate to create a strain in the semiconductor layer to change the semiconductor bandgap under control of an applied voltage,
  wherein the strain application structure is capable of creating a mechanical deformation of the semiconductor layer,
  wherein the substrate, the semiconductor layer, and the strain application structure uses materials to allow selected optical frequencies pass through the device.

12. A method of making as in claim 11, wherein fabricating the strain application structure further comprises fabricating at least two contacts coupled to the semiconductor.

13. A method of making as in claim 11, further comprising:
  fabricating the semiconductor layer to comprise germanium; and
  fabricating the substrate to comprise silicon.

14. A method of making as in claim 11, wherein fabricating the semiconductor layer comprises depositing semiconductor material onto the substrate under conditions suitable to produce intrinsic strain within the semiconductor layer.

15. A method for changing the optical frequencies transmitted through a semiconductor comprising:
applying a voltage to a strain application structure coupled to the semiconductor,
wherein the strain application structure is capable of creating a mechanical deformation of the semiconductor layer;
creating a variable strain in the semiconductor through interaction with the strain application structure under control of the applied voltage; and
changing the semiconductor bandgap energy in response to the variable strain to control the optical frequencies passing through the semiconductor at the predetermined optical frequency.

16. A method as in claim 15, wherein creating a variable strain in the semiconductor comprises interacting mechanically with the strain application structure.

17. A method as in claim 15 wherein creating a strain in the semiconductor decreases the semiconductor energy bandgap and thereby increases the optical cutoff wavelength to about 1550 nanometers.

18. A method as in claim 15, further comprising:
illuminating the semiconductor with a predetermined optical energy at the predetermined optical frequency;
modulating the optical absorption by varying the voltage.

19. A method as in claim 15, further comprising:
illuminating the semiconductor with optical energy;
absorbing optical energy at the predetermined optical frequency in the semiconductor in relation to the applied voltage; and
creating an electrical output signal in response to the absorption of the predetermined optical frequency.

20. A method as in claim 19, wherein absorbing optical energy at the predetermined optical frequency in the semiconductor further comprises absorbing optical energy in relation to the intensity of the optical energy.

* * * * *